United States Patent [19]
Meissner et al.

[11] Patent Number: 5,990,625
[45] Date of Patent: Nov. 23, 1999

[54] LCD HAVING NOISE COUNTERACTING PARALLEL RESONANT CIRCUIT

[75] Inventors: Ralph Meissner, Erlangen; Rainer Kuth, Herzogenaursch; Wolfgang Pritzel, Prutting, all of Germany

[73] Assignee: Siemens Aktiengesellschaft, Munich, Germany

[21] Appl. No.: 08/940,466

[22] Filed: Sep. 30, 1997

[30] Foreign Application Priority Data

Sep. 30, 1996 [DE] Germany ............... 196 40 057

[51] Int. Cl.⁶ ........................................... G02F 1/13
[52] U.S. Cl. ................... 315/85; 349/59; 348/819
[58] Field of Search ..................... 315/8, 85; 349/59; 348/819, 820

[56] References Cited

U.S. PATENT DOCUMENTS

| | | | |
|---|---|---|---|
| 4,700,034 | 10/1987 | Lee | 174/35 R |
| 5,101,139 | 3/1992 | Lechter | 315/85 |
| 5,568,112 | 10/1996 | Cure | 315/8 |

FOREIGN PATENT DOCUMENTS

| | | |
|---|---|---|
| 24 45 003 A1 | 4/1976 | Germany . |
| 31 31 137 A1 | 2/1983 | Germany . |
| 44 14 971 A1 | 7/1995 | Germany . |

*Primary Examiner*—Justin P. Bettendorf
*Attorney, Agent, or Firm*—Hill & Simpson

[57] ABSTRACT

In an electrical assembly with an electrical or electronic component part that generates a noise signal with a disturbing frequency, a parallel resonant circuit tuned to the frequency is arranged in the immediate proximity of the component part.

3 Claims, 1 Drawing Sheet

LCD HAVING NOISE COUNTERACTING PARALLEL RESONANT CIRCUIT

BACKGROUND OF THE INVENTION

The invention is directed to an electrical assembly with an electrical or electronic component or part that generates noise signals with a disturbing frequency.

Diagnostic magnetic resonance apparatus work with high-frequency electromagnetic fields in the megahertz range. Two things occur. First, the magnetic resonance apparatus for exciting the nuclear magnetic resonance in an examination region of a patient emits high-power high-frequency pulses that can disturb the function of neighboring devices and equipment. Second, the magnetic resonance apparatus must receive and evaluate extremely low-power magnetic resonance signals that are emitted from the examination region. The magnetic resonance apparatus is, therefore, surrounded by an electro-magnetic shielding chamber to prevent disturbing interactions between the magnetic resonance apparatus and other electrical and electronic equipment.

It is often desirable to use other electrical or electronic devices in the shielding chamber in the immediate proximity of the magnetic resonance apparatus. For example, for interventional techniques in an open magnetic resonance apparatus, a further console for the input of commands with a monitor is required in the immediate proximity of the magnetic resonance apparatus. Noise emission from components with noise parts on the magnetic resonant frequency are problematical given such an arrangement since they can lead to the presence of artifacts in the magnetic resonance image. When an LCD module (liquid crystal display module) is utilized as a monitor, line switching with a basic frequency of, for example, 64 kHz also generates harmonics in the range of the magnetic resonance frequency.

SUMMARY OF THE INVENTION

An object of the invention is to provide an electrical assembly, whereby noise signals with disturbing frequencies are reduced.

In an embodiment, this object is achieved in that a parallel resonant circuit tuned to the frequency is arranged in the immediate proximity of the component part. When the assembly is utilized in the immediate proximity of the magnetic resonance apparatus, the disturbing frequency part is the frequency of the nuclear magnetic resonance. The resonant circuit is tuned to the magnetic resonance frequency. Then the resonant circuit removes the emitted energy at this frequency from the environment of the component part and converts it into heat energy. The noise emission is thus selectively reduced at the magnetic resonance frequency.

This anti-interference measure can be utilized successfully anywhere that noise signals with one or a few selected frequencies are to be reduced. In the latter instance, a plurality of parallel resonant circuits can be provided.

In an embodiment of the invention, the parallel resonant circuit comprises a frame coil. Such frame coil is especially sensitive to the magnetic parts in the noise signal.

In another embodiment of the invention, at least the electrical or the electronic component part is surrounded by electrical shielding. The electrical shielding further reduces the emitted noise signals.

In yet another embodiment of the invention, the electrical shielding includes an opening. The opening can be provided for viewing purposes such as for a monitor.

For a further reduction of the noise emission, the opening can be covered with an electrically conductive lattice, wherein the lattice is electrically connected to the shielding.

These and other features of the invention are discussed in greater detail below in the following detailed description of the presently preferred embodiments with reference to the accompanying drawings.

DETAILED DESCRIPTION OF THE PRESENTLY PREFERRED EMBODIMENTS

Figure 1:
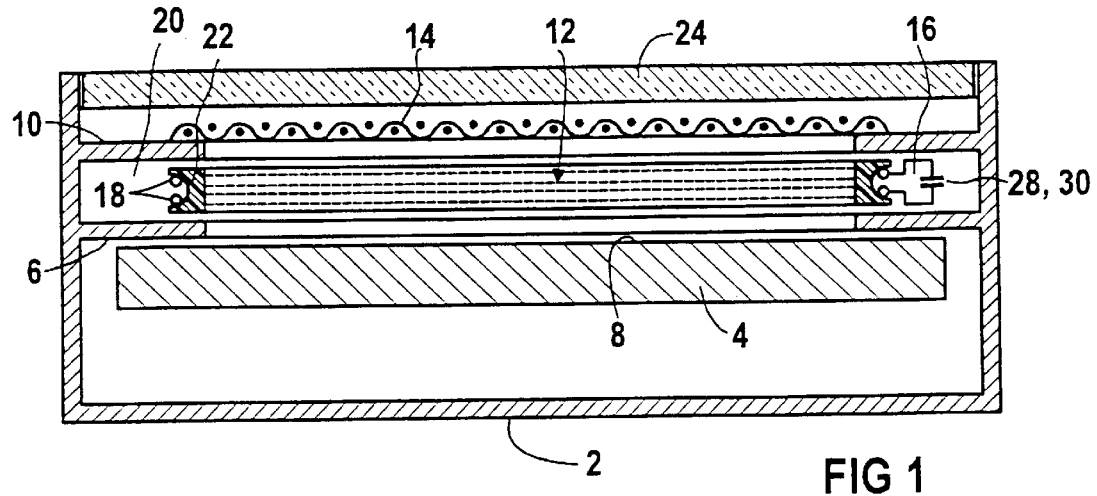
FIG. 1 illustrates a schematic sectional view of the structure of a radio-shielded electrical assembly that comprises an LCD module as disturbing component parts.

A monitor shown in a sectional view in FIG. 1 in terms of its fundamental structure is radio-shielded to such an extent that it can be utilized in the immediate proximity of a diagnostic magnetic resonance apparatus. The monitor is suitable both for displaying an image of a patient as well as for presenting graphic use surfaces for the control of the magnetic resonance apparatus. This information can be required for the implementation of an intervention guided by magnetic resonance.

In FIG. 1, an LCD module 4 is secured to an all-around web 6 within an aluminum housing 2 serving as shielding. The web 6 is fashioned such that it does not cover a display or surface 8 of the LCD module 4 with its individual, selectable image elements.

During operation, the LCD module 4 generates noise signals in the megahertz range at every line switching during which more than 1000 switching transistors are activated and deactivated. As discussed above, these noise signals potentially deteriorate the operation of the magnetic resonance apparatus without anti-interference measures. By contrast thereto, the interfering effect of other electrical and electronic component parts (not shown here) required for the operation of the LCD module and likewise accommodated in the housing 2 is only slight.

An auxiliary web 10 that is likewise dimensioned such that the observation surface 8 is not covered is fashioned parallel to the web 6 at a spacing of approximately 2 cm from the web 6. The web 6 and the auxiliary web 10 delimit a rectangular opening 12 in the aluminum housing 2 that allows an unobstructed view of the display surface 8. The opening 12 is electromagnetically shielded by a thin platinum fabric 14 that is electrically conductively connected to the auxiliary web 10. The platinum fabric 14 is fashioned so thin that the recognizability of the information displayed by the LCD module 4 is only insignificantly deteriorated. This, however, means that the shielding effect of the platinum fabric 14 is inadequate for shielding the strong electromagnetic disturbances emanating from the LCD module 4. For further reduction and attenuation of the noise signal, a parallel resonance circuit 16 is provided that is tuned to the disturbing frequency in the noise signal spectrum and that is arranged in the immediate proximity of the LCD module 4. In the present application, the disturbing frequency is the frequency of the nuclear magnetic resonance. If the LCD module 4 only emits disturbances with a frequency in the proximity of the magnetic resonance frequency, the parallel resonant circuit 16 can also be tuned to this frequency.

The illustrated parallel resonant circuit 16 comprises a rectangularly fashioned frame coil that is introduced in an interspace 20 formed by the web 6 and auxiliary web 10. The individual turns of the frame coil 18 are wound on a plastic member 22 that is fashioned such that an unobstructed view onto the display surface 8 is possible. For protection, the opening 12 wit the platinum fabric 14 is covered by a glass panel 24.

In the exemplary embodiment, the parallel resonant circuit 16 is tuned to a resonant frequency of 8.4 MHZ, this corresponding to the frequency of the nuclear magnetic resonance of a 0.2 Tesla magnetic resonance apparatus.

Figure 2:
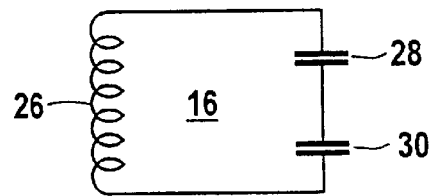
FIG. 2 illustrates an electrical equivalent diagram of a parallel resonant circuit employed for interference suppression.

In an electrical equivalent diagram of the resonant circuit 16, FIG. 2 shows that a series circuit comprised of two capacitors 28 and 30 is connected in parallel to the inductance 26 formed by the frame coil 18. Sytroflex capacitors are utilized as capacitors 28 and 30. The first capacitor 28 has a capacitance of 220 PF and a second capacitor 30 has a capacitance of 470 PF.

Figure 3:
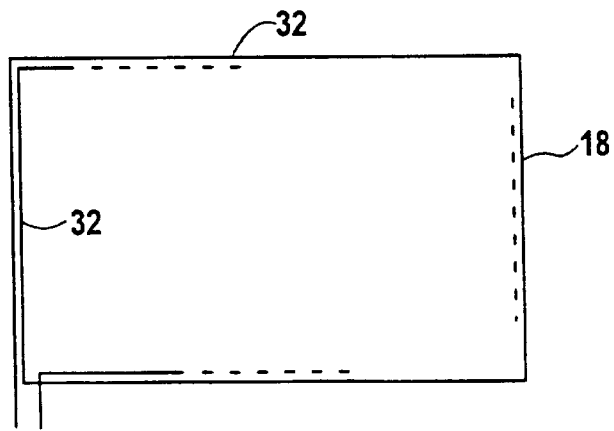
FIG. 3 illustrates a plan view of the fundamental structure of the frame coil utilized in the parallel resonant circuit.

FIG. 3 shows, in a plan view, the rectangular turns 32 of the frame coil 18. The turns 32 of the frame coil 18 thereby surround an area of approximately 300 mm×240 mm. In order to obtain the inductance 26 required for resonance, eleven turns of a standard copper conductor having a diameter of 1.35 mm and 30 individual leads each having a diameter of 0.1 mm are wound. In the non-installed condition, the resonant circuit achieves a no-load quality of approximately 500. In the installed condition, a quality of approximately 200 is achieved due to the proximity of the metallic housing 2. Overall, an attenuation of the noise signal of at least 7 dB, typically 10 dB is achieved. The monitor thus no longer causes the presence of any artifacts in the magnetic resonance image.

Although modifications and changes may be suggested by those skilled in the art, it is the intention of the inventors to embody within the patent warranted hereon all changes and modifications as reasonably and properly come within the scope of their contribution to the art.

What is claimed is:

1. In an electrical assembly with an LCD module with a display surface that generates noise signals with a disturbing frequency, the improvement comprising a parallel resonant circuit tuned to the frequency which is arranged in the immediate proximity of the LCD module, the parallel resonant circuit comprising a frame coil, the LCD module being surrounded by an electrical shielding, the electrical shielding comprises an opening, the opening being covered with an electrically conductive fabric which is electrically connected to the shielding, and the opening being founded by the frame coil.

2. In the electrical assembly according to claim 1, characterized in that the frame coil is rectangular.

3. In the electrical assembly of claim 1, the electrically conductive fabric is a platinum fabric.

* * * * *